US006294318B1

(12) United States Patent
Matsumoto et al.

(10) Patent No.: US 6,294,318 B1
(45) **Date of Patent: *Sep. 25, 2001**

(54) PLATE SURFACE PROTECTIVE AGENT FOR LITHOGRAPHIC PRINTING PLATE, AND FOUNTAIN SOLUTION COMPOSITION FOR LITHOGRAPHIC PRINTING PLATE

(75) Inventors: Hiroshi Matsumoto; Yasue Harada, both of Shizuoka (JP)

(73) Assignee: Fuji Photo Film Co., Ltd., Minami-Ashigara (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/387,497

(22) Filed: Sep. 1, 1999

(30) Foreign Application Priority Data

Sep. 9, 1998 (JP) ........................................ 10-254732
Sep. 25, 1998 (JP) ........................................ 10-271677

(51) Int. Cl.[7] ........................................ G03F 7/38
(52) U.S. Cl. ........................................ 430/331
(58) Field of Search .............................. 430/309, 331

(56) References Cited

U.S. PATENT DOCUMENTS

| | | | | |
|---|---|---|---|---|
| 4,374,036 | * | 2/1983 | Canale et al. | 430/309 |
| 5,126,068 | | 6/1992 | Burke et al. | 510/421 |
| 5,637,444 | * | 6/1997 | Matsumoto | 430/331 |
| 5,714,302 | | 2/1998 | Urasaki et al. | 430/204 |
| 5,780,416 | * | 7/1998 | Kiewert et al. | 510/421 |

FOREIGN PATENT DOCUMENTS

| | | |
|---|---|---|
| 0 304 662 | 3/1989 | (EP) . |
| 0 504 916 | 9/1992 | (EP) . |

* cited by examiner

*Primary Examiner*—Hoa Van Le
(74) *Attorney, Agent, or Firm*—Burns, Doane, Swecker & Mathis, LLP

(57) ABSTRACT

A plate surface protective agent for a lithographic printing plate and a fountain solution composition for a lithographic printing plate are disclosed, each comprising at least one compound selected from the group consisting of the compounds represented by the following formula:

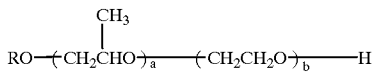

wherein R, a and b are defined hereinbefore.

1 Claim, No Drawings

PLATE SURFACE PROTECTIVE AGENT FOR LITHOGRAPHIC PRINTING PLATE, AND FOUNTAIN SOLUTION COMPOSITION FOR LITHOGRAPHIC PRINTING PLATE

FIELD OF THE INVENTION

The present invention relates to a plate surface protective agent for a lithographic printing plate. The present invention also relates to a fountain solution composition for a lithographic printing plate, particularly a fountain solution composition useful for an offset printing process of a lithographic printing plate.

BACKGROUND OF THE INVENTION

In making a lithographic printing plate, a so-called gum solution is coated in the final process.

The gum solution is coated for the purpose of not only protecting the water wettability of the non-image region but also preventing the plate from scumming or flaws caused by the adhering of fingerprints, ink oil or dirt at the image correction such as addition or deletion on the image region, during storage until the plate is used for printing after the plate making or until the plate is again used, at the time of mounting the plate to a press, or during the operation. Furthermore, the gum solution is coated to prevent the generation of oxidation scumming.

Heretofore, an aqueous solution of gum arabic, cellulose gum or a water-soluble polymer material having a carboxyl group within the molecule has been generally used as the gum solution for a lithographic printing plate. These gum solutions have, however, the following problems. That is, in the final process for finishing the printing plate, a gum solution is poured on the plate, extended throughout the plate surface with a sponge or cotton tampon and then rubbed with a cloth until the plate surface is dried. At this time, the thickness of the water-soluble polymer material coated partially remains large in the image region (region of receiving ink). The image area on the large thickness part is poor in the inking property at the printing and a fairly large number of sheets must be printed until a printed matter having a desired ink density can be obtained. In general, this phenomenon is called as dropout printing (so-called inking failure).

For solving this problem, use of a plate surface protective agent for a lithographic printing plate, containing a nonionic surfactant such as polyoxyethylene-polyoxypropylene block copolymer is conventionally known. on the other hand, in the trend, the environmental safety is a matter of great importance and a highly safe plate surface protective agent for a lithographic printing plate is being demanded. Another important matter is the reduction of the waste solution and in the predominant plate making process, the plate surface protective gum is coated on a developed plate as it is without passing through water washing. Under these circumstances, a novel plate surface protective agent having good coatability and running suitability with good durability is demanded. In particular, a plate surface protective agent having long-term stability against the mixing of a developer component is demanded.

Further, the lithographic printing is a printing system ingeniously using the property such that water and oil are substantially not mingled with each other. The printing plate surface consists of a region of accepting water and repelling oily ink and a region of repelling water and accepting oily ink. The former is a non-image region and the latter is an image region.

The desensitizing agent has an action of enlarging the surface chemical difference between the image region and the non-image region by wetting the non-image region with a fountain solution containing the desensitizing agent.

Heretofore, as the fountain solution, an aqueous solution containing an alkali metal salt or ammonium sat of bichromic acid, a phosphoric acid or a salt thereof such as an ammonium salt, or a colloid substance such as gum arabic or carboxymethyl cellulose (CMC) is commonly known.

However, the fountain solution containing only such a compound disadvantageously has difficulty in uniformly wetting the non-image area of the plate and therefore, suffers from a problem such that the printed matter is sometimes stained or a considerable high skill is necessary for controlling the amount of the fountain solution supplied.

In order to overcome these problems, a Dahlgren system of using an aqueous solution containing from about 20 to 25% of isopropyl alcohol has been proposed. This system is advantageous in many points in view of workability and fidelity of the printed matter. For example, wetting of the non-image area is improved, the amount of the fountain solution can be reduced, the balance in the amount between the printing ink and water supplied is easily controlled, the amount of the fountain solution emulsified into the printing ink decreases and in turn, transferability of the printing ink to a blanket is improved.

However, the isopropyl alcohol readily evaporates and in order to maintain a constant isopropyl alcohol concentration in the fountain solution, a special apparatus is required and this gives rise to increase in the cost. Furthermore, the isopropyl alcohol has a peculiar malodor and also has a problem in the toxicity, accordingly, use thereof is not preferred in view of the working environment. In the case of applying a fountain solution containing an isopropyl alcohol to offset printing where a dampening roller is usually used, the isopropyl alcohol evaporates on the roller or plate surface and disadvantageously fails in exerting the effect.

In recent years, social concern for the industrial pollution is very high and discharge of chromium ions in the waste solution is strictly regulated. There is also a tendency to regulate the use of an organic solvent such as isopropyl alcohol in view of the safe hygiene. Accordingly, a fountain solution free of these substances is being demanded.

In order to satisfy this demand, for example, JP-B-55-25075 (the term "JP-B" as used herein means an "examined Japanese patent publication"), JP-B-55-19757 and JP-B-58-5797 describe a composition containing various surfactants. However, in using such a composition as the fountain solution, the surfactant concentration must be fairly high. Furthermore, in actual lithographic printing, the ink and water under the ink roll, printing plate or fountain solution supplying roll rotating at a high speed, are vigorously moving, therefore, as a matter of problem, water may adhere to the ink film or ink may diffuse on the surface of water. The combination with a surfactant proposed in the above-described publications is not enough to completely solve these problems. Moreover, the fountain solution containing such a surfactant has a defect such that bubbling readily occurs during pumping or stirring.

On the other hand, U.S. Pat. No. 3,877,372 describes a solution containing a mixture of ethylene glycol monobutyl ether with at least one of hexylene glycol and ethylene glycol. U.S. Pat. No. 4,278,467 describes a fountain solution containing at least one of n-hexoxydiethylene glycol, n-hexoxyethylene glycol, 2-ethyl-1,3-hexanediol, n-butoxyethylene glycol acetate, n-butoxydiethylene glycol acetate and 3-butoxy-2-propanol. JP-A-57-199693 (the term "JP-A" as used herein means an "unexamined published Japanese patent application") describes a fountain solution containing at least one completely water-soluble compound selected from propylene glycol, ethylene glycol, dipropylene glycol, diethylene glycol, hexylene glycol, triethylene glycol, tetraethylene glycol, tripropane glycol and 1,5-pentanediol. These fountain solution compositions are free of isopropyl alcohol and advantageous in view of the safe hygiene, however, still have a problem such that the non-image area of a PS plate comprising an anodized aluminum substrate cannot be completely wetted during printing, the non-image area is scummed particularly at the time of high-speed printing, the half-tone image area fails to have a normal shape, and as a result, the halftone image area suffers from generation of so-called ink spreading due to enlarged and uneven dot shapes. Furthermore, 2-ethyl-1,3-hexanediol does not have a sufficiently high solubility in water and is disadvantageous in obtaining a high-concentration concentrated fountain solution or an additive for the fountain solution.

SUMMARY OF THE INVENTION

In view of the above circumstances, the present invention has been made by finding that a specific compound is effective when it is used in a plate treatment of a lithographic printing plate. More specifically, a first embodiment of the present invention is to apply such a specific compound to a plate surface protective agent, and a second embodiment of the present invention is to apply such a specific compound to a fountain solution composition.

Accordingly, an object in the first embodiment of the present invention is to provide a plate surface protective agent having a high environmental safety.

Another object in the first embodiment of the present invention is to provide a plate surface protective agent capable of desensitizing the non-image region of a lithographic printing plate and at the same time, having a high stability such that no dropout printing occurs even after storage for a long period of time.

Still another object in the first embodiment of the present invention is to provide a plate surface protective agent which can be easily applied to a plate using a sponge, cotton tampon or automatic gum coater and in the system such that the plate surface protective agent is coated on a plate as it is after the development in an automatic developing machine without passing through water washing, enables use for a long period of time by virtue of capability of maintaining the stability against the mingling of a developer component.

The object in the second embodiment of the present invention is to provide a fountain solution for a lithographic printing plate, which is safe for the working environment and can exert satisfactory effects under the conditions of respective members rotating at a high speed.

As a result of extensive investigations to attain the above-described objects in the first embodiment, the present inventors have found that the objects can be attained by incorporating a specific surfactant to the plate surface protective agent for a lithographic printing plate. The first embodiment of present invention has been accomplished based on this finding.

Further, as a result of extensive studies on the component being safe for the environment, capable of reducing the dynamic surface tension with a small amount and ensuring a proper emulsification balance with the printing ink, the present inventors have found the above-described object in the second embodiment can be easily attained by using a specific compound. The second embodiment of the present invention has been accomplished based on this finding.

More specifically, the first embodiment of the present invention relates to a plate surface protective agent for a lithographic printing plate, comprising at least one compound selected from the compounds represented by the following formula (I):

(I)

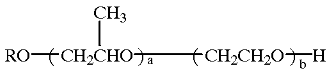

wherein R represents an alkyl group having from 8 to 22 carbon atoms, and a and b each represents an integer of from 1 to 50.

The second embodiment of the present invention relates to a fountain solution composition for a lithographic printing plate, comprising at least one compound represented by the following formula (II):

(II)

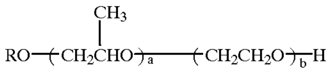

wherein R represents a hydrocarbon group having from 8 to 18 carbon atoms, and a and b each represents an integer of from 1 to 10.

DETAILED DESCRIPTION OF THE INVENTION

The first and second embodiments of present invention are described in detail below.

First Embodiment

In formula (I) representing the compound for use in the present invention, R represents an alkyl group having from 8 to 22 carbon atoms, more preferably from 12 to 18 carbon atoms. The alkyl group may be linear or branched. Examples of the alkyl group include a lauryl group, a cetyl group, an oleyl group and a stearyl group. Among these alkyl groups, preferred are a lauryl group, a cetyl group and an oleyl group.

In formula (I), a and b each represents an integer of from 1 to 50, preferably from 2 to 20, more preferably from 4 to 10. In particular, b as the number of oxyethylene is preferably selected between the equimolar amount and one third in mol of the oxypropylene added.

Such compounds are commercially available.

The compound for use in the present invention is suitably has an HLB value of generally from 6 to 15, preferably from 7 to 13. The HLB value is often used as an index in the selection of a nonionic surface active agent and may be determined by a method commonly used. The method is described, for example, in *Surface Active Agent Handbook*, Kogaku Tosho (Oct. 1, 1968). According to this publication, those having an HLB of from 1 to 3 are not dispersed in water, those having an HLB of from 3 to 6 are slightly dispersed in water, those having an HLB of from 6 to 8 are dispersed in water under vigorous stirring and assume a milky solution, those having an HLB of from 8 to 10 are stably dispersed in water and assume a milky solution, those having an HLB of from 10 to 13 are dispersed and form a translucent or transparent solution, and those having an HLB of 13 or more are dispersed and form a transparent solution. Two or more of these compounds may be used in combination and in this case, the HLB value may be calculated by the method commonly used for the determination of an HLB of a mixed surfactant. When a single compound is used and the compound has an HLB value of 13 or more, bubbling readily occurs and accordingly, automatic coater suitability as one of the functions of the plate surface protective agent is liable to deteriorate. In such a case, the HLB value may be controlled by using two or more kinds of compounds having different HLB values in combination.

The plate surface protective agent of the present invention may be prepared as a plate surface protective agent of various types such as solution type, emulsion type or solubilization type.

In the case of a solution-type plate surface protective agent, the compound of formula (I) is suitably selected and used such that the HLB value falls within the range of from 9 to 13, and in general, the compound is contained in an amount of from 0.1 to 5 wt %, preferably from 0.3 to 3 wt %, based on the entire weight of the plate surface protective agent.

In the case of an emulsion-type plate surface protective agent, the compound of formula (I) is suitably selected and used such that the HLB value falls within the range of from 6 to 13, preferably from 7 to 10, and in general, the compound is contained in an amount of from 0.1 to 10 wt %, preferably from 0.5 to 5 wt %, based on the entire weight of the plate surface protective agent.

In the case of a solubilization-type plate surface protective agent, the compound of formula (I) is suitably selected and used such that the HLB value falls within the range of from 9 to 15, preferably from 10 to 15. The content of the compound represented by formula (I) greatly varies depending upon the compound solubilized, however, it is generally from 0.1 to 10 wt %, preferably from 0.5 to 7 wt %, based on the entire weight of the plate surface protective agent.

The plate surface protective agent for a lithographic printing plate of the present invention may contain an emulsifier (surfactant) in addition to the above-described compound.

For example, an anionic surfactant and/or a nonionic surfactant may be used. Examples of the anionic surfactant include fatty acid salts, abietates, hydroxyalkane-sulfonates, alkanesulfonates, dialkylsulfosuccinates, linear alkylbenzenesulfonates, branched alkylbenzene-sulfonates, alkylnaphthalenesulfonates, alkylphenoxypoly-oxyethylenepropylsulfonates, polyoxyethylenealkylsulfo-phenylether salts, sodium N-methyl-N-oleyltaurines, diamide disodium N-alkylsulfosuccinates, petroleum sulfonates, sulfated castor oil, sulfated beef tallow oil, sulfates of fatty acid alkyl ester, alkylsulfates, polyoxyethylene alkyl ether sulfates, fatty acid monoglyceride sulfates, polyoxyethylene alkylphenylether sulfates, polyoxyethylene styrylphenylether sulfates, alkyl phosphates, polyoxyethylene alkyl ether phosphates, polyoxyethylene alkylphenylether phosphates, partially saponified products of styrene-maleic anhydride copolymer, partially saponified products of olefin-maleic anhydride copolymer, and naphthalenesulfonate formalin condensates. Among these, dialkylsulfosuccinates, alkylsulfates and alkylnaphthalene-sulfonates are preferred.

Examples of the nonionic surfactant include polyoxyethylene alkyl ethers, polyoxyethylene alkylphenyl ethers, polyoxyethylene alkylphenyl ethers, polyoxyethylene polystyrylphenyl ethers, glycerin fatty acid partial esters, sorbitan fatty acid partial esters, pentaerythritol fatty acid partial esters, propylene glycol monofatty acid esters, sucrose fatty acid esters, polyoxyethylene sorbitan fatty acid partial esters, polyoxyethylene sorbitol fatty acid partial esters, polyethylene glycol fatty acid esters, polyglycerin fatty acid partial esters, polyoxyethylene glycerin fatty acid partial esters, fatty acid diethanolamides, N,N-bis-2-hydroxyalkylamines, polyoxy-ethylene alkylamines, triethanolamine fatty acid esters and trialkylamine oxides. Among these, polyoxyethylene alkylphenyl ethers and polyoxyethylene-polyoxypropylene block copolymers are preferred.

Furthermore, anionic and nonionic surfactants such as an oxyethylene adduct of acetylene glycol-based or acetylene alcohol-based surfactant, a fluorine-based surfactant, and a silicon-based surfactant, may also be used.

These surfactants may be used in combination of two or more thereof. For example, a combination of two or more anionic surfactants different from each other, or a combination use of an anionic surfactant with a nonionic surfactant is preferred. From these compounds, an appropriate surfactant is preferably selected and used while taking account of the effect on the environment.

The amount of the surfactant used is not particularly limited, however, it is preferably from 0.01 to 20 wt % based on the entire weight of the plate surface protective agent.

In addition to those described above, the plate surface protective agent for a lithographic printing plate of the present invention may contain the following components:

(a) a water-soluble polymer compound, (b) an inorganic acid and/or an organic acid, and a salt thereof, (c) a wetting agent, (d) an antiseptic, and (e) if desired, (1) a sparingly water-soluble solvent having a boiling point of 150° C. or more, (2) a nitrate or sulfate, (3) a chelating compound, and (4) a defoaming agent.

Examples of the water-soluble polymer compound as the component (a) , which can be preferably used, include gum arabic, dextrin, denatured starch, cellulose derivatives (e.g., carboxymethyl cellulose, carboxyethyl cellulose, methyl cellulose) and denatured products thereof, pullurane, polyvinyl alcohol and derivatives thereof, polyvinyl pyrrolidone, polyacrylamide and copolymers thereof, vinyl methyl ether/maleic anhydride copolymers, vinyl acetate/maleic anhydride copolymers, styrene/maleic anhydride copolymers, and soybean polysaccharides. Among these, gum arabic, dextrin, denatured starch, carboxymethyl cellulose and soybean polysaccharides are preferred.

In the present invention, these compounds may be used in combination of one or more thereof. The content of the compound is suitably from 0.1 to 50 wt %, preferably from 0.3 to 30 wt %, based on the entire weight of the plate surface protective agent for a lithographic printing plate.

The plate surface protective agent for a lithographic printing plate of the present invention is advantageously used in the acidic region at a pH of from 2.5 to 5, and the inorganic acid and/or organic acid or a salt thereof as the component (b) is used to adjust the pH to from 2.5 to 5. In general, a mineral acid, an organic acid or an inorganic salt is used. The amount of the mineral acid, organic acid or inorganic salt added is from 0.01 to 3 wt % based on the entire weight of the plate surface protective agent. Examples of the mineral acid include nitric acid, sulfuric acid, phosphoric acid and metaphosphoric acid. Examples of the organic acid include citric acid, acetic acid, oxalic acid, malonic acid, p-toluenesulfonic acid, tartaric acid, malic acid, lactic acid, levulinic acid, phytic acid and an organic phosphonic acid. Examples of the inorganic salt include sodium primary phosphate, sodium secondary phosphate, sodium hexametaphosphate and sodium tripolyphosphate. These mineral acids, organic acids or inorganic acids may be used at least individually or in combination of two or more thereof.

Examples of the wetting agent as the component (c), which can be suitably used, include ethylene glycol, propylene glycol, triethylene glycol, butylene glycol, hexylene glycol, diethylene glycol, dipropylene glycol, glycerin, trimethylolpropane and diglycerol. These wetting agents may be used either individually or in combination of two or more thereof. In general, the wetting agent is used in an amount of from 0.1 to 5 wt % based on the entire amount of the plate surface protective agent.

Examples of the antiseptic as the component (d), which can be preferably used, include phenol and derivatives thereof, formalin, imidazole derivatives, sodium dehydroacetate, 4-isothiazolin-3-one derivatives, benzoisothiazolin-3-one, benzotriazole derivatives, amidine guanidine derivatives, quaternary ammonium salts, derivatives of pyridine, quinoline or guanidine, derivatives of diazine or triazole, derivatives of oxazole or oxazine, and nitrobromoalcohol-based antiseptics such as 2-bromo-2-nitropropane-1,3-diol, 1,1-dibromo-1-nitro-2-ethanol and 1,1-dibromo-1-nitro-2-propanol.

The antiseptic is preferably added in an amount sufficiently large to stably exert the effect against bacteria, fungi or yeast. The amount varies depending on the kind of the bacteria, fungi or yeast, but it is preferably from 0.01 to 4 wt % based on the plate surface protective agent actually used. Two or more antiseptics are preferably used in combination so as to exert the effect against various fungi or bacteria.

The compound as (1) the sparingly water-soluble organic solvent having a boiling point of 150° C. or more of the component (e) includes a plasticizer having a freezing point of 15° C. or less and a boiling point at 1 atm. of 300° C. or more. Examples thereof include phthalic acid diester agents such as dibutyl phthalate, diheptyl phthalate, di-n-octyl phthalate, di(2-ethylhexyl) phthalate, dinonyl phthalate, didecyl phthalate, dilauryl phthalate and butylbenzyl phthalate, aliphatic dibasic acid esters such as dioctyl adipate, butyl glycol adipate, dioctyl azelate, dibutyl sebacate, di(2-ethylhexyl) sebacate and dioctyl sebacate, epoxidized triglycerides such as epoxidized soybean oil, phosphoric acid esters such as tricresyl phosphate, trioctyl phosphate and trichloroethyl phosphate, and benzoic acid esters such as benzyl benzoate.

In addition, an alcohol-based compound may be used and examples thereof include 2-octanol, 2-ethylhexanol, nonanol, n-decanol, undecanol, n-dodecanol, trimethylnonylalcohol, tetradecanol and benzyl alcohol.

Also, a glycol-based compound may be used and examples thereof include ethylene glycol isoamyl ether, ethylene glycol monophenyl ether, ethylene glycol benzyl ether, ethylene glycol hexyl ether and octylene glycol.

Furthermore, a hydrocarbon-based compound may be used and examples thereof include aromatic or aliphatic compounds as a petroleum fraction having a boiling point of 160° C. or more, and squalane.

In selecting the compound, its environmental safety, particularly odor, is taken into account.

The amount of the solvent used is suitably from 0.1 to 3 wt %, preferably from 0.3 to 2.0 wt %, based on the entire weight of the plate surface protective agent. These solvents may be used either individually or in combination of two or more thereof.

Examples of (2) the nitrate or sulfate of the component (e) include magnesium nitrate, sodium nitrate, potassium nitrate, ammonium nitrate, sodium sulfate, potassium sulfate, ammonium sulfate, sodium hydrogensulfate and nickel sulfate.

For economic reasons, the plate surface protective agent is usually commercially available as a concentrated solution and actually used by diluting it with tap water or well water. The tap water or well water used for the dilution contains calcium ion or the like and this adversely affects the printing to cause staining of the printed matter. In order to eliminate this problem, a chelating compound may be added. Examples of (3) the chelating compound which can be preferably used include organic phosphonic acids and phosphonoalkanetricarboxylic acids such as ethylenediaminetetraacetic acid, a potassium salt thereof and a sodium salt thereof; diethylene-triaminepentaacetic acid, a potassium salt thereof and a sodium salt thereof; triethylenetetraminehexaacetic acid, a potassium salt thereof and a sodium salt thereof; hydroxyethylethylenediaminetriacetic acid, a potassium salt thereof and a sodium salt thereof; nitrilotriacetic acid and a sodium salt thereof; 1-hydroxyethane-1,1-diphoshonic acid, a potassium salt thereof and a sodium salt thereof; and aminotri (methylenephosphonic acid), a potassium salt thereof and a sodium salt thereof. In place of the sodium salt or potassium salt chelating agent, an organic amine salt may also be effectively used. From these, a chelating agent which can be stably present in the plate surface protective agent composition and does not inhibit the printing property, is selected. The amount of the chelating agent added is suitably from 0.001 to 1.0 wt % based on the plate surface protective agent actually used.

As (4) the defoaming agent, a silicone-based self-emulsifying or emulsifying surfactant in general or a nonionic compound having an HLB of 5 or less may be used. A silicone defoaming agent is preferred and this may be either emulsion-dispersing type or solubilizing type. The content of the defoaming agent is most suitably from 0.001 to 1.0 wt % based on the plate surface protective agent actually used.

The plate surface protective agent of the present invention may be prepared as a solution type, an emulsion type or a solubilization type by respective methods commonly used. For example, the plate surface protective agent of the present invention may be produced as an emulsified solution by an emulsion-dispersing process such that an aqueous phase is controlled to a temperature of 40° C.±5° C. and stirred at a high speed, an oil phase prepared is gradually added dropwise to the aqueous phase and after thorough stirring, the mixture is passed through a homogenizer with pressure control.

The plate surface protective agent of the present invention can be used for either a positive lithographic printing plate or a negative lithographic printing plate. The plate surface protective agent of the present invention can be uniformly coated even by an automatic gumming machine. The treatment with the plate surface protective agent of the present invention may be performed immediately after the development without passing through water washing or may be performed through a treatment with a rinsing solution containing a surfactant after the development (including water washing, washing with running water in circulation or washing by coating a small amount of water).

The plate surface protective agent for a lithographic printing plate of the present invention has an excellent effect on the protection of ink receptivity of the image area and on the protection of water wettability of the non-image area.

The plate surface protective agent for a lithographic printing plate of the present invention is advantageous in that the compound represented by formula (I) used therein has a high environmental safety, the emulsification stability is high and does not deteriorate even after storage for a long period of time so that the plate surface on the image area can be highly protected, and excellent running suitability is ensured because the stability can be maintained even when a developer is mixed therewith.

More specifically, the inking property on the image area is good, accordingly, color matching on printing can be performed within a short time, production of a large number of bad printed matters can be prevented, and a highly satisfactory and clear printed matter can be obtained right after the printing. The printing plate treated with the plate surface protective agent of the present invention also exhibits its good inking property even after storage.

Second Embodiment:

In formula (II) representing the compound for use in the present invention, R represents an aliphatic hydrocarbon group having from 8 to 18 carbon atoms, preferably from 10 to 16 carbon atoms. The hydrocarbon group may be either linear or branched, or either saturated or unsaturated. Specifically, R added to the oxypropylene is preferably a monohydric alcohol of alkane or alkene. For example, n-octanol, 2-octanol, 2-ethylhexanol, 3,5,5-trimethylhexanol, nonanol, n-decanol, undecanol, n-dodecanol (lauryl alcohol), trimethylnonyl alcohol, tetradecanol, heptadecanol, cetyl alcohol, oleyl alcohol or the like is preferably added. In particular, an addition product of the compound, having from 10 to 16 carbon atoms is suitably used.

The polymerization molar number of oxypropylene (a in the formula) is from 1 to 10, preferably from 4 to 8. The polymerization molar number of oxyethylene (b in the formula) is from 1 to 10, preferably the polymerization molar number of oxypropylene or less. If the polymerization molar number of oxypropylene exceeds 10 mol, the fountain solution suitability is liable to deteriorate and also, solubility and water solubility decrease.

If the polymerization molar number of oxyethylene exceeds 10 mol, the dynamic surface tension is liable to deteriorate and the fountain solution is greatly reduced in the wettability and compatibility with ink, giving rise to ready occurrence of the water log phenomenon of the fountain solution composition.

In the fountain solution composition for a lithographic printing plate of the present invention, the compounds represented by formula (II) may be used either individually or in combination of two or more thereof.

In the fountain solution composition, the content of the compound represented by formula (II) is suitably from 0.001 to 3.0 wt %, preferably from 0.05 to 2.0 wt %, based on the entire weight of the fountain solution composition. If the content of the compound is less than 0.001 wt %, the effect as the object of the present invention cannot be satisfactorily brought out, whereas if it exceeds 2.0 wt %, solubility in water decreases and the compound floats on the surface of water, giving rise to the problem that the solution as a whole is liable to be uneven.

Specific examples of the compound represented by formula (II) are set forth below. These compounds can be produced by an ordinary organic synthesis method.

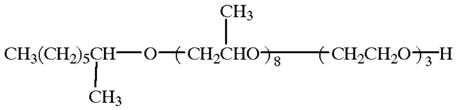

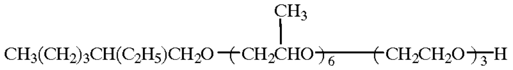

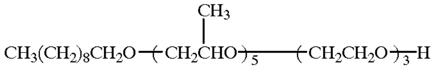

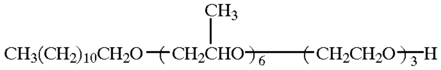

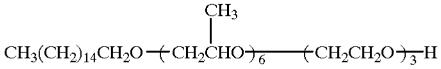

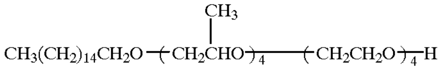

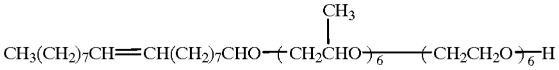

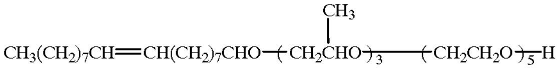

In addition to the above-described compound, the fountain solution composition for a lithographic printing plate of the present invention may contain, if desired, the following compound so as to control the dynamic surface tension, improve the solubility or suppress the ink emulsification ratio to an appropriate range. Specific examples of the compound include ethylene glycol monomethyl ether, diethylene glycol monomethyl ether, triethylene glycol monomethyl ether, polyethylene glycol monomethyl ether, ethylene glycol monoethyl ether, diethylene glycol monoethyl ether, triethylene glycol monoethyl ether, ethylene glycol monobutyl ether, diethylene glycol monobutyl ether, triethylene glycol monobutyl ether, ethylene glycol monoisobutyl ether, diethylene glycol monoisobutyl ether, triethylene glycol monoisobutyl ether, ethylene glycol monopropyl ether, diethylene glycol monopropyl ether, triethylene glycol monopropyl ether, ethylene glycol mono-tert-butyl ether, diethylene glycol mono-tert-butyl ether, triethylene glycol mono-tert-butyl ether, ethylene glycol monohexyl ether, diethylene glycol monohexyl ether, triethylene glycol monohexyl ether, ethylene glycol monophenyl ether, diethylene glycol monophenyl ether, triethylene glycol monophenyl ether, propylene glycol, dipropylene glycol, tripropylene glycol, tetrapropylene glycol, propylene glycol monomethyl ether, dipropylene glycol monomethyl ether, tripropylene glycol monomethyl ether, propylene glycol monoethyl ether, dipropylene glycol monoethyl ether, tripropylene glycol monoethyl ether, tetrapropylene glycol monoethyl ether, propylene glycol monopropyl ether, dipropylene glycol monopropyl ether, tripropylene glycol monopropyl ether, propylene glycol monoisopropyl ether, dipropylene glycol monoisopropyl ether, tripropylene glycol monoisopropyl ether, propylene glycol monobutyl ether, dipropylene glycol monobutyl ether, tripropylene glycol monobutyl ether, propylene glycol monoisobutyl ether, dipropylene glycol monoisobutyl ether, tripropylene glycol monoisobutyl ether, propylene glycol mono-tert-butyl ether, dipropylene glycol mono-tert-butyl ether and tripropylene glycol mono-tert-butyl ether.

Of these compounds, preferred are ethylene glycol monobutyl ether, ethylene glycol mono-tert-butyl ether, propylene glycol monopropyl ether and propylene glycol monobutyl ether.

Other examples include polypropylene glycol having a molecular weight of from 200 to 1,000 and a monomethyl ether thereof; monoethyl ether, monopropyl ether, monobutyl ether, 2-ethyl-1,3-hexanediol, and an oxyethylene/oxypropylene adduct thereof; acetylene alcohol, acetylene glycol, and an oxyethylene/oxypropylene adduct thereof; an oxypropylene adduct of glycerin; an oxyethylene/oxypropylene adduct of trimethylolpropane; an oxyethylene/oxypropylene adduct of sorbitol; 3-methoxybutanol, 3-methyl-3-methoxybutanol, tetrahydrofurfuryl alcohol, and ethanol.

Of these compounds, 2-ethyl-1,3-hexanediol, an oxyethylene adduct of acetylene glycol, ethylene glycol monobutyl ether, propylene glycol monobutyl ether, dipropylene glycol monobutyl ether and polypropylene glycol monoalkyl (having from 1 to 4 carbon atoms) ether having an average addition molar number of from 2 to 10 are particularly effective as the dynamic surface tension auxiliary agent; ethylene glycol mono-tert-butyl ether, 3-methyl-3-methoxybutanol, 3-methoxybutanol and tetrahydro-furfuryl alcohol are suitably used as the solubilizing agent; and an oxyethylene adduct of 2-ethyl-1,3-hexanediol and an oxyethylene adduct of trimethylolpropane are suitably used as the ink emulsification controlling agent.

These compounds may be used either individually or in combination of two or more thereof, and the amount used is preferably from 0.01 to 7 wt %, more preferably from 0.05 to 5 wt %, based on the entire weight of the fountain solution composition.

As the pH buffer for use in the fountain solution composition of the present invention, a water-soluble organic acid and/or an inorganic acid or a salt thereof may be used. These compounds are effective for the pH adjustment or pH buffering of the fountain solution, or for the appropriate etching or corrosion inhibition of the lithographic printing plate support. Preferred examples of the organic acid include citric acid, ascorbic acid, malic acid, tartaric acid, lactic acid, acetic acid, gluconic acid, hydroxyacetic acid, oxalic acid, malonic acid, levulinic acid, sulfanilic acid, p-toluenesulfonic acid, phytic acid and organic phosphonic acid. Examples of the inorganic acid include phosphoric acid, nitric acid, sulfuric acid and polyphosphoric acid. Furthermore, an alkali metal salt, alkaline earth metal salt, ammonium salt or organic amine salt of these organic acids and/or inorganic acids may be suitably used. These organic acids, inorganic acids and/or salts thereof may be used individually or in combination of two or more thereof.

The amount of the pH buffer added to the fountain solution composition of the present invention is preferably from 0.001 to 0.3 wt % based on the entire weight of the fountain solution composition. The fountain solution composition is preferably used in the acidic region at a pH of from 3 to 7 but may also be used in the alkaline region at a pH of from 7 to 11 by containing a phosphoric acid, an alkali metal salt, an alkali carbonate metal salt or a silicate.

The fountain solution composition of the present invention may further contain, if desired, components such as (f) a water-soluble polymer compound, (g) a chelating compound, (h) an antiseptic, (i) an anticorrosive, (j) a coloring agent, (k) a perfume and (m) a defoaming agent.

Examples of (f) the water-soluble polymer compound which can be used in the present invention include natural products and denatured products thereof, such as gum arabic, starch derivatives (e.g., dextrin, enzymolysis dextrin, hydroxypropylated enzymolysis dextrin, carboxymethylated starch, phosphoric acid starch, octenylsuccinated starch), alginate, and cellulose derivatives (e.g., carboxymethyl cellulose, carboxyethyl cellulose, methyl cellulose); and synthetic products such as polyethylene glycol and copolymers thereof, polyvinyl alcohol and derivatives thereof, polyvinyl pyrrolidone, polyacrylamide and copolymers thereof, polyacrylic acid and copolymers thereof, a vinyl methyl ether/maleic anhydride copolymer, a vinyl acetate/maleic anhydride copolymer, and polystyrene sulfonic acid and copolymers thereof.

The content of the water-soluble polymer is suitably from 0.0001 to 0.1 wt %, preferably from 0.0005 to 0.05 wt %, based on the entire weight of the fountain solution composition.

The concentrated fountain solution composition is usually used after diluting it by adding thereto tap water or well water. The tap water or well water used for the dilution contains calcium ion and this adversely affects the printing to readily cause staining of the printed matter. In such a case, the problem may be overcome by adding (g) a chelating compound. Preferred examples of (g) the chelating compound include organic phosphonic acids and phosphonoalkanetricarboxylic acids such as ethylenediaminetetraacetic acid, a potassium salt thereof and a sodium salt thereof; diethylenetriaminepentaacetic acid, a potassium salt thereof and a sodium salt thereof; triethylenetetraminehexaacetic acid, a potassium salt thereof and a sodium salt thereof; hydroxyethylethylenediaminetriacetic acid, a potassium salt thereof and a sodium salt thereof; nitrilotriacetic acid and a sodium salt thereof; L-glutamic acid diacetate, a potassium salt thereof and a sodium salt thereof; N,N-bis-carboxymethyl-alanine trisethanolamine salt; 1-hydroxyethane-1,1-diphoshonic acid, a potassium salt thereof and a sodium salt thereof; and aminotri(methylenephosphonic acid), a potassium salt thereof and a sodium salt thereof. In place of the sodium salt or potassium salt chelating agent, an organic amine salt may also be effectively used. From these, a chelating agent which can be stably present in the fountain solution composition and does not inhibit the printing property, is selected. The amount of the chelating agent added to the fountain solution composition is suitably from 0.0001 to 1.0 wt %, preferably from 0.0005 to 0.1 wt %.

Examples of (h) the antiseptic which can be used in the fountain solution composition of the present invention include phenol and derivatives thereof, formalin, imidazole derivatives, sodium dehydroacetate, 4-isothiazolin-3-one derivatives, benzotriazole derivatives, amidine or guanidine derivatives, quaternary ammonium salts, derivatives of pyridine, quinoline or guanidine, derivatives of diazine or triazole, derivatives of oxazole or oxazine, bromonitropropanol, 1,1-dibromo-1-nitro-2-ethanol, 3-bromo-3-nitropentane and 2,4-diol. The antiseptic is preferably added in an amount sufficiently large to stably exert the effect against bacteria, fungi or yeast. The amount varies depending on the kind of the bacteria, fungi or yeast, but it is preferably from 0.001 to 1.0 wt % based on the fountain solution composition. Two or more antiseptics are preferably used in combination so as to exert the effect against various fungi, bacteria or yeast.

Examples of (i) the anticorrosive which can be used in the fountain solution composition of the present invention include benzotriazole, 5-methylbenzotriazole, thiosalicylic acid, benzimidazole and derivatives thereof.

Preferred examples of (j) the coloring agent which can be used in the fountain solution composition of the present invention include dyes for food. Examples thereof include CI Nos. 19140 and 15985 for the yellow dye, CI Nos. 16185, 45430, 16255, 45380 and 45100 for the red dye, CI Nos. 42640 for the violet dye, CI Nos. 42090 and 73015 for the blue dye, and CI No. 42095 for the green dye.

By incorporating a slight amount of (k) a perfume which can be used in the fountain solution composition of the present invention, the printing environment can be elevated. For example, by masking the odor with a fragrant olive smell, a lemon smell or a vanillin smell, use of the fountain solution is more facilitated.

As (m) the defoaming agent which can be used in the fountain solution composition of the present invention, a silicone defoaming agent is preferred and either an emulsion-dispersing type or a solubilizing type may be used.

The fountain solution composition for a lithographic printing plate of the present invention is generally concentrated in the commercialization on a usual commercial base. On actual use, the concentrated solution is preferably diluted with tap water or well water to from 30 to 500 times in view of profitability.

The fountain solution composition as used in the present invention includes in the concept thereof a fountain solution adding liquid composition (usually, circulated as a composition free of a pH buffer and a water-soluble polymer compound) which is used by mixing it with an etching solution.

The fountain solution composition of the present invention is safe in view of the environmental hygiene and has excellent capability of reducing the dynamic surface tension. In particular, the chromium roller and rubber roller in a dampening system of continuous supplying type can be satisfactorily wetted and therefore, the fountain solution composition can be supplied to the non-image area of a printing plate surface as a uniform water film. The components employed in the fountain solution composition of the present invention are scarcely dissolved in ink, accordingly, their concentrations can be kept constant in the fountain solution composition and in turn, the ink density on the printed matter can be easily controlled. As a result, good printing suitability is revealed and a printed matter having excellent stability can be obtained.

Furthermore, bubbling which is a problem encountered in the surfactant system is reduced. With respect to the environment in the printing room, the solvent odor is converted into a refreshing smell and good working environment is attained. Even when the fountain solution composition is prepared in the concentrated form, the components can remain being dissolved and the homogeneity can be maintained, therefore, the solution can be used with ease.

The present invention is described in greater detail below by referring to the Examples, but the present invention should not be construed as being limited thereto.

EXAMPLES 1 TO 4 AND COMPARATIVE EXAMPLES 1 TO 4

Emulsion-type plate surface protective agents and solution-type plate surface protective agents were manufactured using Compounds A to C as the compound represented by formula (I) for use in the present invention and Comparative Compounds D to F, and then subjected to a comparison test. Structures of Compounds A to F are shown below.

A) 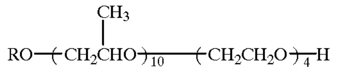

R = $C_{16}$

B) 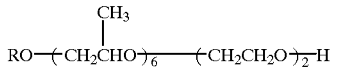

R = mixture of $C_{12-14}$

C) 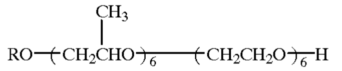

R = $C_{22}$

D) 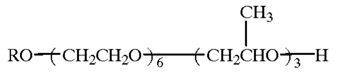

R = mixture of $C_{12-14}$

E) 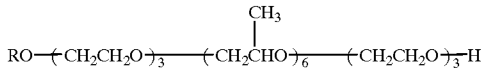

R = nonylphenyl

F) 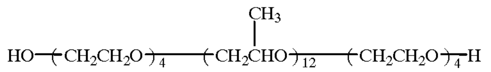

(1) Preparation of Emulsion-Type Plate Surface Protective Agent

Preparation of Aqueous Phase

A water-soluble polymer (protective colloid agent) was dissolved in pure water under heating and therein, a pH adjusting agent and a wetting agent were in sequence dissolved. After adding all, the temperature was controlled to 40° C.±5° C.

Preparation of Oil Phase

Surfactants and benzyl alcohol were added to dibutyl sebacate (DBS) and the mixture was stirred to form a uniform solution.

Emulsion-Dispersion

The aqueous phase was controlled to 40° C. and the oil phase was slowly added dropwise thereto while stirring the aqueous phase at a rate of 500 to 600 rpm by Three-One Motor (manufactured by Shinto Scientific Co., Ltd.). After the completion of dropwise addition, pure water was added to make a total amount of 1,000 ml and the solution was further stirred for 10 minutes. Thereafter, the mixed solution was emulsified by a homogenizer with pressure control to prepare a plate surface protective agent.

This plate surface protective agent was diluted with water to 1:1 on actual use.

(2) Preparation of Solution-Type Plate Surface Protective Agent

A water-soluble polymer was dissolved in pure water, and each additive was then successively dissolved therein to prepare a solution-type plate surface protective agent.

This plate surface protective agent was diluted with water to 1:1 on actual use.

The composition of each plate surface protective agent is shown in Table 1 below. The unit is g (gram).

TABLE 1

| | Emulsion Type | | | | | | Solution Type | |
|---|---|---|---|---|---|---|---|---|
| | Example | | | Comparative Example | | | Example | Comparative Example |
| | 1 | 2 | 3 | 1 | 2 | 3 | 4 | 4 |
| Aqueous phase | | | | | | | | |
| Pure water | 500 | 500 | 500 | 500 | 500 | 500 | 500 | 500 |
| Gum arabic | 100 | 50 | — | 100 | 50 | — | 100 | 100 |
| Soybean polysaccharide | — | 50 | 100 | — | 50 | 100 | 150 | 150 |
| Cream dextrin | 150 | 150 | 150 | 150 | 150 | 100 | 50 | 50 |
| Enzymolysis dextrin | 50 | 50 | 50 | 50 | 50 | 50 | 50 | 50 |
| Glycerin | 20 | 20 | 20 | 20 | 20 | 20 | 20 | 20 |
| Phosphoric acid (85%) | 3 | 3 | 3. | 3 | 3 | 3 | 3 | 3 |
| Ammonium dihydrogen phosphate | 10 | 10 | 10 | 10 | 10 | 10 | 5 | 5 |
| Antiseptic* | 0.3 | 0.3 | 0.3 | 0.3 | 0.3 | 0.3 | 0.3 | 0.3 |
| Oil phase | | | | | | | | |
| Plasticizer (DBS) | 10 | 10 | 10 | 10 | 10 | 10 | — | — |
| Compound A | 12 | — | 10 | — | — | — | 6 | — |
| Compound B | — | 12 | — | — | — | — | — | — |
| Compound C | — | — | 2 | — | — | — | — | — |
| Compound D | — | — | — | 12 | — | — | — | 6 |
| Compound E | — | — | — | — | 12 | — | — | — |
| Compound F | — | — | — | — | — | 12 | — | — |
| Dialkyl sulfosuccinate (80%) | 15 | 15 | 15 | 15 | 15 | 15 | — | — |
| Sorbitan monooleate | 3 | 3 | 3 | 3 | 3 | 3 | — | — |
| Benzyl alcohol | 8 | 8 | 8 | 8 | 8 | 8 | — | — |
| Pure water | to finally make a total amount of 1,000 ml | | | | | | | |

*Isothiazoline-based

An anodized multi grain type positive PS plate VPS manufactured by Fuji Photo Film Co., Ltd. was developed in a PS automatic developing machine 900D (having a function of coating gum after the development) and the above-described plate surface protective agents each was applied thereto, thereby producing lithographic printing plates.

After the completion of plate making, each lithographic printing plate was divided into two portions, stored under conditions A and B shown in Table 1, and then evaluated on the performance according to the performance evaluating methods shown in Table 3 by making prints using a Heidelberger SORM press.

Each plate surface protective agent was evaluated by visually observing the coated surface state. More specifically, uniformity in the coating among the distal end, the left side and the right side of the plate, and the presence or absence of a thick coated part on the coated surface were observed.

Furthermore, 4 weeks after the preparation, each plate surface protective agent was visually observed and evaluated on the liquid stability (in the case of solution type, floating matters on the upper portion and precipitates on the lower portion of the solution, and in the case of emulsion type, the emulsification stability such as phase separation).

The evaluation results obtained are shown in Table 4.

TABLE 2

| Storage Conditions | |
|---|---|
| A | indoors, 22 to 25° C., 24 hours |
| B | forced storage, 45° C./80% RH, 24 hours |

TABLE 3

| Item | Test Conditions and Method |
|---|---|
| 1 Inking property | Number of sheets printed from the start of printing until the ink can completely adhere to the image area and a normal printed matter can be obtained. |
| 2 Ink oil scumming | 50 $\mu$l of a solution containing 1 g of oleic acid and 50 g of xylene was dropped on a non-image area and scumming of the non-image area was examined. |

TABLE 4

| Storage Condition | Emulsion Type: Example 1 | Emulsion Type: Example 2 | Emulsion Type: Example 3 | Emulsion Type: Comparative Example 1 | Emulsion Type: Comparative Example 2 | Emulsion Type: Comparative Example 3 | Solution Type: Example 4 | Solution Type: Comparative Example 4 |
|---|---|---|---|---|---|---|---|---|
| Inking property (sheets) | | | | | | | | |
| A | 7–10 | 7–10 | 7–10 | 7–10 | 7–10 | 7–10 | 10–12 | 10–12 |
| B | 7–10 | 7–10 | 7–10 | 15–20 | 18–22 | 15–20 | 12–16 | 20–25 |
| Ink oil scumming | | | | | | | | |
| A | ○ | ○ | ○ | ○ | ○ | ○ | ○ | ○ |
| B | ○ | ○ | ○ | ○Δ | ○Δ | ○Δ | ○ | ○Δ |
| Coated surface state | ○ | ○ | ○ | ○Δ | ○Δ | ○Δ | ○ | ○Δ |
| Emulsification stability | ○ | ○ | ○ | Δ | ○Δ | Δ | — | — |
| Liquid stability | — | — | — | — | — | — | ○ | ○Δ |

○: good, Δ: slightly poor, ×: poor.

As seen from Table 4, the emulsion-type plate surface protective agents of Examples 1 to 3 exhibited excellent performance in any of the test items as compared with those of Comparative Examples 1 to 3. Furthermore, the solution-type plate surface protective agent of Example 4 was superior to the plate surface protective agent of Comparative Example 4.

EXAMPLES 5 TO 9 AND COMPARATIVE EXAMPLES 5 TO 9

Various fountain solution compositions were prepared according to the formulations shown in Tables 5 and 6 below. The unit is gram (g) and in each composition, water was added to make 1,000 ml.

Structures of Compounds A to E in the Tables, used in respective Examples are shown later.

TABLE 5

| Component | Example 5 | 6 | 7 | 8 | 9 |
|---|---|---|---|---|---|
| Compound A | 20 | — | — | 30 | 15 |
| Compound B | — | 20 | — | — | |
| Compound C | — | — | 20 | — | 15 |
| Compound D | — | — | — | — | — |
| Compound E | | | | | |
| Solubilizing agent | | | | | |
| 3-Methyl-3-methoxybutanol | 200 | — | 100 | 300 | — |
| Ethylene glycol mono-t-butyl ether | — | 200 | 100 | — | 200 |
| Dynamic surface tension auxiliary agent | | | | | |
| Propylene glycol monobutyl ether | 200 | — | 150 | 300 | — |
| Ethylene glycol monobutyl ether | — | 150 | — | — | 400 |
| dipropylene glycol monobutyl ether | — | — | 50 | — | — |
| Diethylene glycol monobutyl ether | — | 50 | — | — | — |
| pH Buffer | | | | | |
| Phosphoric acid (85%) | 10 | 10 | 10 | — | — |
| Primary ammonium citrate | 25 | 25 | 25 | — | — |
| Nitric acid group | | | | | |
| Ammonium nitrate | 10 | 10 | 10 | — | — |
| Anticorrosive | | | | | |
| Benzotriazole | 0.1 | 0.1 | 0.1 | 0.1 | 0.1 |
| Water-soluble polymer compound | | | | | |
| Hydroxypropyl cellulose (HPC) | 3 | — | 3 | — | — |
| Polyvinyl pyrrolidone (PVP-K15) | | 3 | | — | — |

TABLE 5-continued

| Component | Example 5 | 6 | 7 | 8 | 9 |
|---|---|---|---|---|---|
| Antiseptic | | | | | |
| 4-Isothiazolin-3-one derivative | 2 | 2 | 2 | 2 | 2 |
| 2-Bromo-2-nitropropane-1,3-diol | 2 | 2 | 2 | 2 | 2 |
| Pure water to make | | | 1,000 ml in total | | |

TABLE 6

| Component | Comparative Example 5 | 6 | 7 | 8 | 9 |
|---|---|---|---|---|---|
| Compound G | — | — | — | — | — |
| Compound H | — | — | — | — | — |
| Compound I | — | — | — | — | — |
| Compound J | — | 20 | — | 30 | 15 |
| Compound K | — | — | 20 | — | 15 |
| Solubilizing agent | | | | | |
| 3-Methyl-3-methoxybutanol | 200 | — | 100 | 300 | — |
| Ethylene glycol mono-t-butyl ether | — | 200 | 100 | — | 200 |
| Dynamic surface tension auxiliary agent | | | | | |
| Propylene glycol monobutyl ether | 200 | — | 150 | 300 | — |
| Ethylene glycol monobutyl ether | — | 150 | — | — | 400 |
| Dipropylene glycol monobutyl ether | — | — | 50 | — | — |
| Diethylene glycol monobutyl ether | — | 50 | — | — | — |
| pH Buffer | | | | | |
| Phosphoric acid (85%) | 10 | 10 | 10 | — | — |
| Primary ammonium citrate | 25 | 25 | 25 | — | — |
| Nitric acid group | | | | | |
| Ammonium nitrate | 10 | 10 | 10 | — | — |
| Anticorrosive | | | | | |
| Benzotriazole | 0.1 | 0.1 | 0.1 | 0.1 | 0.1 |
| Water-soluble polymer compound | | | | | |
| Hydroxypropyl cellulose (HPC) | 3 | — | 3 | — | — |
| Polyvinyl pyrrolidone (PVP-K15) | | 3 | | — | — |
| Antiseptic | | | | | |
| 4-Isothiazolin-3-one derivative | 2 | 2 | 2 | 2 | 2 |
| 2-Bromo-2-nitropropane-1,3-diol | 2 | 2 | 2 | 2 | 2 |
| Pure water to make | | | 1,000 ml in total | | |

G) 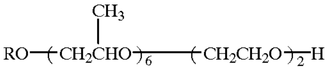

R = $C_{16}$

H) 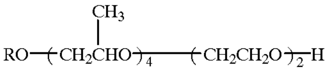

R = mixture of $C_{12-14}$

I) 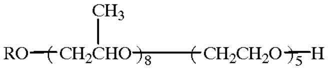

R = $C_{12}$

J) 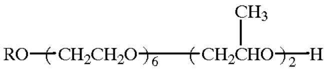

R = $C_{16}$

K) 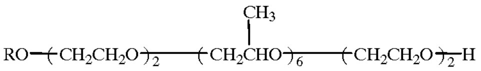

R = mixture of $C_{12-14}$

The thus-prepared fountain solution compositions of Examples 5 to 7 and Comparative Examples 5 to 7 each was diluted to 50 times using a pseudo hard water having a hardness of 400 ppm and then adjusted to have a pH of from 5.0 to 5.3 by adding caustic soda and phosphoric acid. Using these, a printing test was performed. Examples 8 and 9 and Comparative Examples 8 and 9 were each a fountain solution composition which is used in combination with an etching solution (usually called a fountain solution adding liquid composition), therefore, each of these fountain solution compositions was diluted with a 100-fold dilution solution (by a pseudo hard water having a hardness of 400 ppm) of EU-3 (etching solution, trade name, produced by Fuji Photo Film Co., Ltd.) to 50 times and then subjected to the printing test.

The printing test was performed on the items described below using Dia dampening system of a press, Hyplus MZ cyan ink (trade name, produced by Toyo Ink KK) and a plate manufactured according to standard conditions from VPS produced by Fuji Photo Film Co., Ltd. The results obtained are shown in Table 7 below.

(a) Scum of Metering Roll:

The degree of scumming due to attaching of ink to the metering roll for water supply was examined.

| | |
|---|---|
| Good: | A |
| Slightly bad: | B |
| Bad: | C |

(b) Bleeding Property:

After 5,000 or 10,000 sheets were printed, the press was suspended from operation and the degree of bleeding of the ink on the image area into the non-image area was examined.

| | |
|---|---|
| Scarcely bled: | A |
| Slightly bled: | B |
| Heavily bled: | C |

(c) Emulsifying Property:

After 10,000 sheets were printed, the emulsification state of ink on the ink mixing roll was examined.

| | |
|---|---|
| Good: | A |
| Slightly bad: | B |
| Bad: | C |

(d) Continuous Stability:

Using fresh water as the fountain solution, 10,000 sheets were printed and the amount of the fountain solution of not causing staining (minimum water supply amount) was determined. Then, using each of the fountain solutions for the test in this minimum water supply amount, printing was performed. The continuous stability was judged by the number of sheets printed until staining was generated on the printed matter.

| | |
|---|---|
| 10,000 Sheets or more: | A |
| From 3,000 to less than 10,000 sheets: | B |

(e) Rib Mark Suitability (susceptibility to rainfall-like rib marks)

The state of solid part and the state of side dot part at a press speed of 10,000 rph or 500 rph were observed.

TABLE 7

| | Example | | | | | Comparative Example | | | | |
|---|---|---|---|---|---|---|---|---|---|---|
| Test | 5 | 6 | 7 | 8 | 9 | 5 | 6 | 7 | 8 | 9 |
| Scumming of metering roll | A | A | A | A | A | A–B | A–B | A–B | A–B | A–B |
| Bleeding property | A | A | A | A | A | A–B | A–B | A–B | A–B | A–B |
| Emulsifying property | A | A | A | A | A | B | C | C | C | C |
| Continuous stability | A | A | A | A | A | C | C | C | C | C |
| Rib mark suitability | A | A | A | A | A | C | C | C | C | C |

As apparent from Table 7, the fountain solution compositions of the present invention exhibited excellent results in any of the test items, revealing that good printed matters were obtained and the compositions had excellent fountain solution suitability.

While the invention has been described in detail and with reference to specific examples thereof, it will be apparent to one skilled in the art that various changes and modifications can be made therein without departing from the spirit and scope thereof.

What is claimed is:

1. A fountain solution composition for a lithographic printing plate, comprising at least one compound selected from the group consisting of ethylene glycol, monobutyl ether, ethylene glycol mono-tert-butyl-ether, propylene glycol monopropyl ether and propylene glycol monobutyl ether in an amount of from 0.01 to 7 wt % based on the weight of the fountain solution composition and at least one compound represented by the following formula (II) in an amount of from 0.001 3.0 wt % based on the weight of the fountain solution:

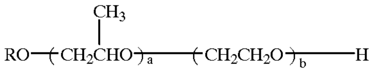
(II)
wherein R represents a hydrocarbon group having 16 carbon atoms, and a and b each represents an integer of from 1 to 10.
* * * * *